United States Patent [19]
Ross, Jr. et al.

[11] Patent Number: 5,808,933
[45] Date of Patent: Sep. 15, 1998

[54] ZERO-WRITE-CYCLE MEMORY CELL APPARATUS

[75] Inventors: Robert Anthony Ross, Jr., Cedar Park; Gus Yeung, Austin, both of Tex.

[73] Assignee: International Business Machines Corporation, Armonk, N.Y.

[21] Appl. No.: 828,917

[22] Filed: Mar. 28, 1997

[51] Int. Cl.$^6$ ................................................. G11C 11/00
[52] U.S. Cl. .................... 365/156; 365/154; 365/189.01; 365/189.11
[58] Field of Search .................................. 365/154, 156, 365/189.01, 189.11

[56] References Cited

U.S. PATENT DOCUMENTS

| | | | |
|---|---|---|---|
| 4,580,245 | 4/1986 | Ziegler et al. | 365/154 |
| 4,845,676 | 7/1989 | Lohlein et al. | 365/154 |
| 4,928,266 | 5/1990 | Abbott et al. | 365/189.01 |
| 4,995,001 | 2/1991 | Dawson et al. | 365/154 |
| 5,040,146 | 8/1991 | Mattausch et al. | 365/154 |
| 5,265,047 | 11/1993 | Leung et al. | 365/154 |
| 5,289,432 | 2/1994 | Dhong et al. | 365/230.05 |

*Primary Examiner*—David C. Nelms
*Assistant Examiner*—Vanthu Nguyen
*Attorney, Agent, or Firm*—Anthony V. S. England; Kermit D. Lopez; Andrew J. Dillon

[57] ABSTRACT

A zero-write-cycle memory cell apparatus for simultaneously reading and writing data to and from a memory cell via isolated read and write wordlines wherein read cycles operate without dedicated write cycles. The zero-write-cycle memory cell apparatus includes a memory cell or storage circuit for the storage of binary data and a write circuit for writing binary data to the memory cell or storage circuit wherein the write circuit includes a write wordline. The presence of a binary data signal at the write wordline optimizes write performance independently of a read path from the memory cell. The zero-write-cycle memory cell apparatus further includes a read circuit for reading binary data from the memory cell or storage circuit. The read circuit includes a read wordline. The presence of a binary data signal at the read wordline optimizes read performance independently of a write path into said memory cell. The zero-write-cycle memory cell apparatus additionally includes a write-enable device, coupled to the memory cell or storage circuit, for providing a write-enable signal to the memory cell. The write-enable circuit can be shared by other memory cells to form a memory array. The zero-write-cycle memory cell apparatus is designed such that dedicated write cycles do not occur, only dedicated read cycles.

15 Claims, 6 Drawing Sheets

ZERO-WRITE-CYCLE MEMORY CELL APPARATUS

BACKGROUND OF THE INVENTION

1. Technical Field

The present invention relates, in general, to integrated circuit technology and, in particular, to the design of very large-scale integrated circuits. More particularly, the present invention relates to the design of memory arrays utilized in very large-scale integrated circuit devices. Still more particularly, the present invention relates to the design of improved cells utilized in such memory arrays.

2. Description of the Related Art

Metal-oxide-semiconductor (MOS) memories belong to a type of integrated circuit having a high degree of integration. Such memories can be divided into the following main groups according to the type of information storage which they provide: MOS memories having dynamic information storage, MOS memories having static information storage, and MOS memories having non-volatile information storage. In the case of the present invention, the aforementioned middle group of MOS memories (i.e., static) are of special interest. In a static memory cell, information written into the memory cell is stored within the memory cell. The memory cell retains such a condition once set, until the supply voltage is disconnected or is no longer applied to the memory cell for other reasons.

It is possible to structure a memory cell with various MOS techniques. Memory elements form critical components in the implementation of complimentary metal oxide-silicon (CMOS) systems. CMOS technology, in particular, has proven particularly advantageous with reference to low-cost technology. CMOS devices are semiconductor devices that consist of two metal-oxide semiconductor field-effect transistors (MOSFETs), one N-type transistor and one P-type transistor, integrated onto a single silicon chip. Such devices have a very high speed and extremely low power consumption.

Memory elements may be divided into the following categories: random-access memory, serial or sequential-access memory, and content-accessible memory. In general, random-access memory (RAM) is semiconductor-based memory that can be read and written by the microprocessor or other hardware devices. Such memory types may be further divided into static-load, synchronous, and asynchronous categories. Static-load memories require no clock. Synchronous RAMs require a clock edge to enable memory operation. The address to a synchronous memory only needs to be valid for a certain setup time after the clock edge. Asynchronous RAMs recognize address changes and output new data after any such change. The memory cells used in RAMs can further be divided into static structures and dynamic structures. Static cells use some form of latched storage, while dynamic cells use dynamic storage of a charge on a capacitor. A static RAM (SRAM) tends to be faster, but also much larger, than dynamic RAMs.

In traditional differential-signal memory arrays utilizing a standard six-device cell, four transistors are configured to form a cross-coupled latch/memory cell for storing data, and two transistors are utilized to obtain access into the memory cell. A typical six-device cell transistor is composed of a cross-coupled flip-flop, whereby two selection transistors produce the connection between two data lines and memory nodes. Such a six-transistor memory cell is addressed via the word line when reading and writing and is connected to a pair of data lines. A logical "0" or logical "1" can be stored within the memory cell, depending upon whether the left-hand memory node lies at the reference potential or at the potential of the supply voltage.

Transverse current between the supply voltage and the reference potential does not flow to the memory cell in either case, since one of the transistors in the two flip-flop branches is inhibited while the other remains activated. During a read operation wherein data is accessed from such a memory cell, differential data stored within the memory cell is transferred to an attached bitline pair. Read access allows for reading of data, which is the means by which a computer receives information. In devices using such differential-signal memory arrays, differential voltage is allowed to develop on the bitlines until sufficient offset between bitlines has developed to reliably sense the binary state of the memory cell.

With the completion of the read operation, the differential bitline pairs are clamped together and restored high ($V_{DD}$) to cancel the offset generated during the read operation. During a write operation, data is written into the cell through the differential bitline pair. In general, one side of the bitline pair is driven low (i.e., driven to ground), and the other side of the differential pair is driven high ($V_{DD}-V_t$). Following a write, as was previously discussed for the read, the differential bitline pair must be restored to $V_{DD}$ prior to the next read/write access. For a traditional memory array, the time required for sufficient bitline offset development to reliably read the memory cell in addition to the time required to restore one-half of the differential bitline pair from ground to $V_{DD}$ after a write defines the minimum cycle time for the array.

From the foregoing, it can be seen that improvements to either the bitline offset development rate or the bitline restore time following a write operation will increase performance of the memory structure as a whole. It can also be seen from the foregoing that a need exists for a memory cell structure which overcomes the drawbacks of traditional memory arrays. To improve either the bitline offset development rate or the bitline restore time following a write operation, simultaneous reads and writes must occur without dedicated write cycle requirements. In addition, to overcome the aforementioned obstacles of traditional memory cells, read performance must be optimized independently of a write path into the memory cell.

It is known in the art of computer hardware design that storage devices exist which allow data to be simultaneously read and written. For example, "ping-pong" buffers, as utilized in communications, change the direction of transmission so that the sender becomes the receiver and vice versa. In information processing and transferring, ping-pong is the technique of using two temporary storage areas (e.g., buffers), rather than one to hold both input and output data. Thus, a ping-pong buffer is a double buffer in which each part is alternately filled and flushed, resulting in a more or less continuous stream of input and output (i.e., also called double buffering). However, such a double buffer requires two storage areas, which takes up additional space on a memory chip. Such an additional storage area results in an inefficient waste of space and is undesirable in an industry where smaller space is desired (e.g., smaller-spaced computer chips with increased memory). Thus, a memory device which enables simultaneous read and write operations without the necessity of implementing additional storage areas, such as memory cells, is desirable. A need exists for such a device.

In addition, to achieve an improved memory apparatus, read performance must be optimized independently of the write path from the memory cell, and write performance must be optimized independently of the read path. Also, cycle time requirements should be squeezed to an absolute design minimum so that write bitline restore is removed from any critical timing paths into or out of the memory cell. Additionally, to achieve a memory cell which overcomes the limitations of traditional memory cells, additional power savings without any write bitline restore requirements is desirable. Thus, a memory cell which achieves these goals is a desired advance over the aforementioned traditional memory cells.

SUMMARY OF THE INVENTION

It is therefore an object of the present invention to provide for an improved integrated-circuit technology.

It is another object of the present invention to provide an improved integrated-circuit technology for the design of very large-scale integrated circuits.

It is still another object of the present invention to provide for an improved memory cell utilized in memory arrays in integrated circuits.

It is yet another object of the present invention to provide for an improved six-transistor memory cell by providing a memory cell wherein simultaneous read and write operations occur with no dedicated write cycle requirements.

The above and other objects are achieved as is now described. A zero-write-cycle memory cell apparatus for simultaneously reading and writing data to and from a memory cell via isolated read and write wordlines, wherein read cycles operate without dedicated write cycles, is presented. The zero-write-cycle memory cell apparatus includes a memory cell or storage circuit for the storage of binary data and a write circuit for writing binary data to the memory cell or storage circuit, wherein the write circuit includes a write wordline. The presence of a binary data signal at the write wordline optimizes write performance independently of a read path from the memory cell. The zero-write-cycle memory cell apparatus further includes a read circuit for reading binary data from the memory cell or storage circuit. The read circuit includes a read wordline. The presence of a binary data signal at the read wordline optimizes read performance independently of a write path into said memory cell. The zero-write-cycle memory cell apparatus additionally includes a write enable device, coupled to the memory cell or storage circuit, for providing a write enable signal to the memory cell. The write enable circuit can be shared by other memory cells to form a memory array. The zero-write-cycle memory cell apparatus is designed such that dedicated write cycles do not occur, only dedicated read cycles.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 5($b$) is a high-level schematic diagram illustrative of a memory cell having separate read wordlines and write wordlines in accordance with the apparatus of the present invention.

DETAILED DESCRIPTION OF PREFERRED EMBODIMENT

Figure 1:
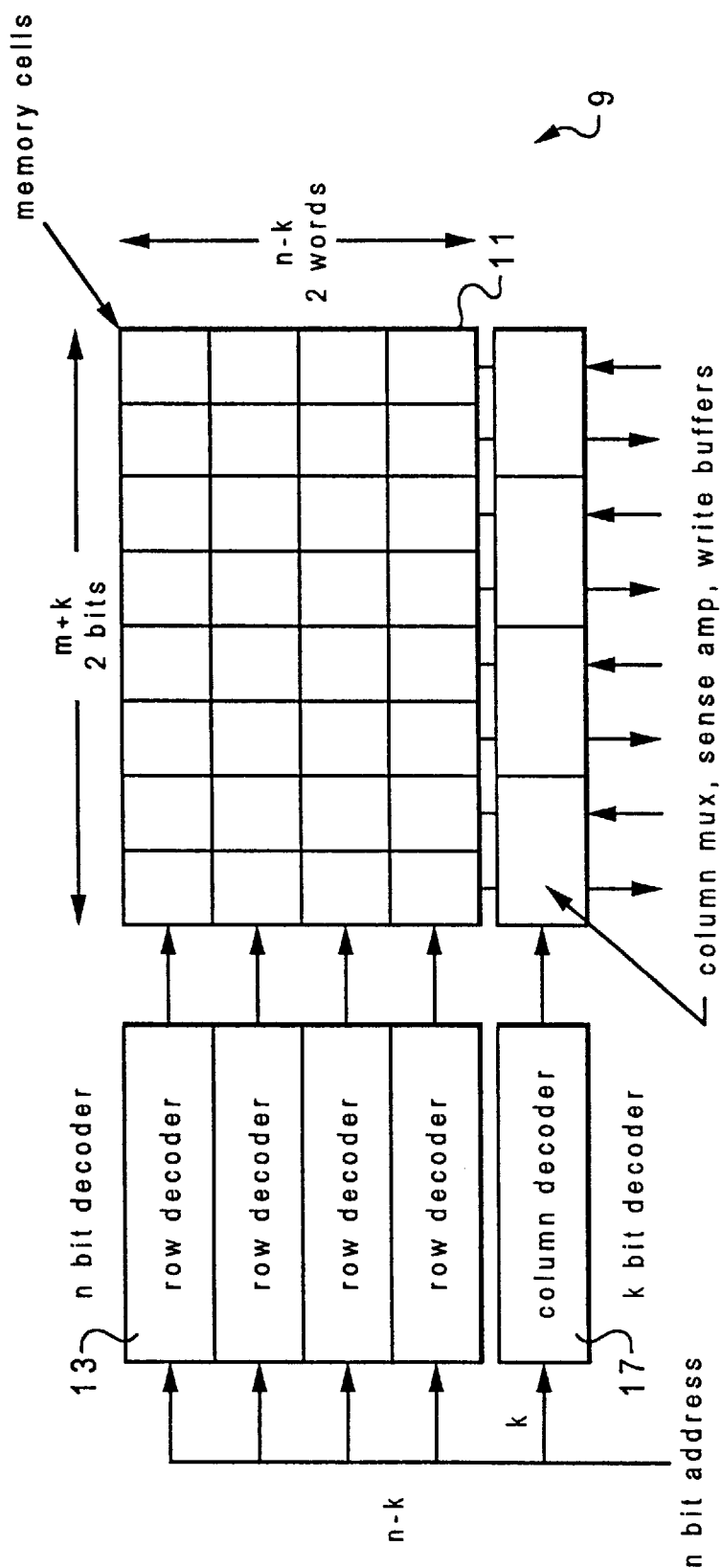
FIG. 1 illustrates a schematic diagram illustrative of a memory-chip architecture in accordance with the apparatus of the present invention.

FIG. 1 is a schematic diagram of memory-chip architecture 9 in accordance with the apparatus of the present invention. FIG. 1 includes memory array 11 having $2^n$-by-$2^m$ bits of storage (actually $2^{n-k}$ by $2^{m+k}$). A row (or word) decoder 13 addresses one word of $2^m$ bits out of $2^{n-k}$ words. A column (or bit) decoder 17 addresses $2^k$ of $2^m$ bits of the accessed row. Column decoder 17 accesses a multiplexer, which routes the addressed data to and from interfaces to the external world. Memory array 11 is one form of a CMOS memory device. In general, row decoder 13 and column decoder 17 are devices that have a number of input lines, of which any number may carry signals, and a number of output lines, of which not more than one may carry a signal at any given instant, and in which there usually is a one-to-one correspondence between the combination of the input and output signals. As utilized herein, the term "address" as utilized with the term "addressing," refers to the value that represents an individually accessible storage location. In a typical computer, each memory location has a separate address. The addresses for the memory system are numbered 0, 1, 2, and so on, up to the maximum-possible number of locations supported.

Figure 2:
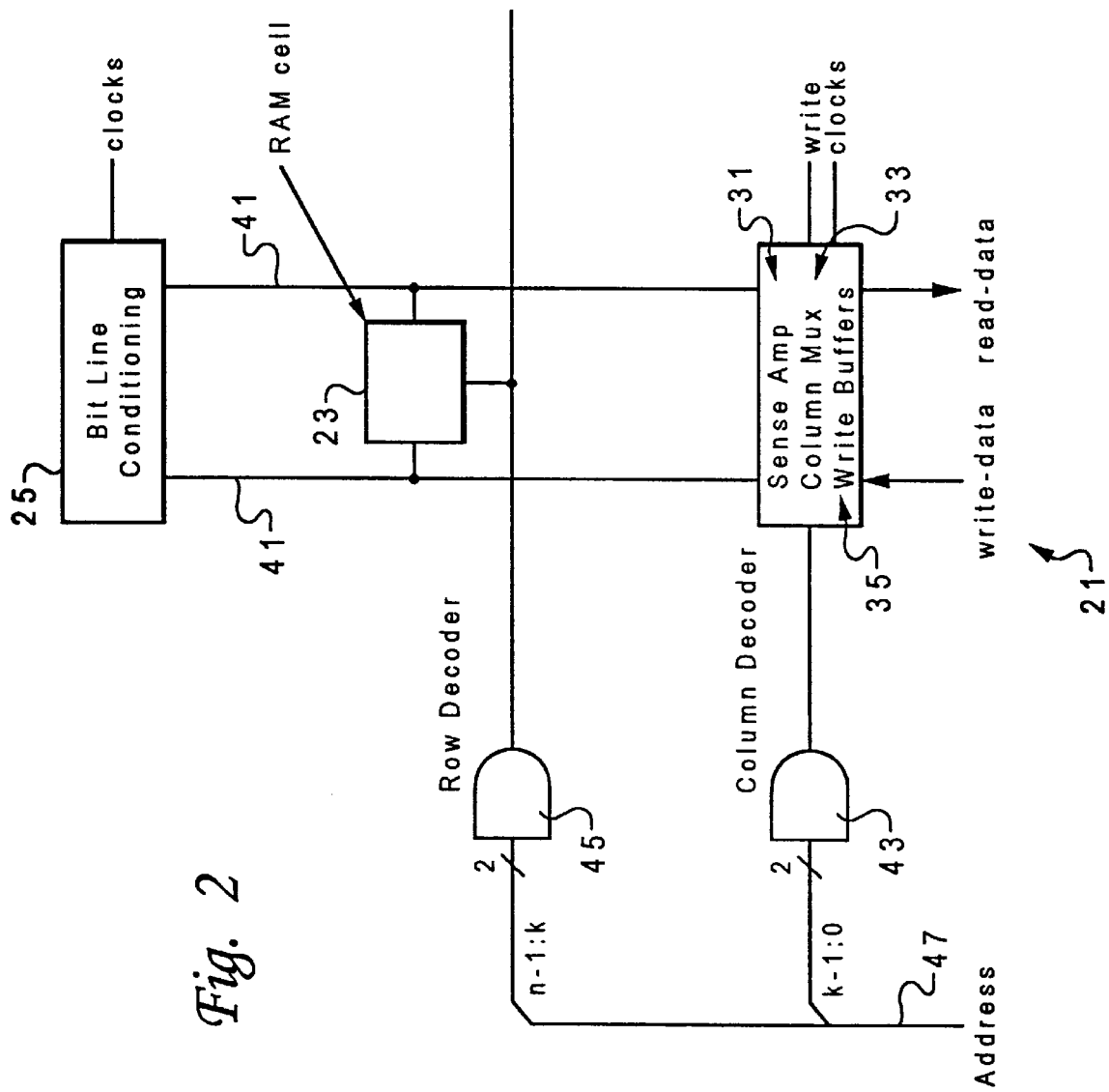
FIG. 2 depicts a schematic diagram illustrative of one row and one column of a generic RAM architecture with support circuits required by the RAM cell in accordance with the apparatus of the present invention.

FIG. 2 shows one row and one column of a generic RAM architecture 21 with support circuits required by a RAM cell 23 in accordance with the apparatus of the present invention. Generic RAM architecture 21 can implement a memory device such as memory array 11 depicted in FIG. 1. In FIG. 2, row decoder 45 is a 1 of n–k decoder which can generally be thought of as an AND gate. One of the $2^{n-k}$ row lines is accessed at one time. Bitline condition circuitry 25, RAM cell 23, sense amplifiers 31, column multiplexors 33, and the write buffers 35 form a tightly coupled circuit that provides for the hazard-free reading and writing of the memory cell. Bitlines 41 are normally run as complementary signals. Column decoder 43 is similar to the row decoder 45 but is 1 of k decoder. Address line 47 is coupled to row decoder 45 and column decoder 43. Output from row decoder 45 is coupled to RAM cell 41. Output from column decoder 43 is coupled to sense amplifier 31, column multiplexer 33 and write buffers 35. In this configuration, k is normally less than n, and the decoder drives a multiplexer (rather than a selector). Frequently, column decoder 43 may be merged with the column multiplexer.

Figure 3:
FIG. 3 illustrates a schematic diagram illustrative of a prior-art six-transistor, single-port memory cell.

FIG. 3 illustrates a schematic diagram illustrative of a prior-art six-transistor, single-port memory cell 10. FIG. 3 depicts an N-type transistor 20 whose source is connected to ground and whose drain is connected to the drain of P-type transistor 28 at node A. The gate of N-type transistor 20 is tied to the gate of P-type transistor 28 at node B. Node B is further connected to the drain of N-type transistor 18 whose source is tied to ground. The drain of N-type transistor 18 is also tied to the drain of P-type transistor 26 at node B. The drain of N-type transistor 24 is also tied to node B, and the source of N-type transistor 24 is tied to bitline 14. In addition, the gate of N-type transistor 24 is tied to wordline 16, which is also tied to the gate of N-type transistor 22. N-type transistor 22 functions within the configuration of FIG. 3 as a transfer device. The drain of N-type transistor 22 is tied to bitline 12, and the source of N-type transistor 22 is tied to node A, as depicted in FIG. 3.

In FIG. 3, four transistors are configured to form a cross-coupled latch memory cell for storing data. These four transistors are: N-type transistors 20 and 18 and P-type transistors 28 and 26. Two transistors, N-type transistors 22 and 24, are utilized by a differential-signal memory array to obtain access into the memory cell 10. During a read access, differential data stored within memory cell 10 is transferred to an attached bitline pair, bitline 12 and bitline 14. Differential voltage is allowed to develop on these bitlines until a sufficient voltage offset between the bitlines (e.g., 100–200 mv) has developed to reliably sense the binary state of memory cell 10. With the completion of the read, the differential bitline pairs are clamped together and restored high (i.e., $V_{DD}$) to cancel the offset voltage generated during the read operation. During a write access, data is written into memory cell 10 through the differential bitline pair of bitline 12 and bitline 14. In general, one side of the bitline pair is driven low (i.e., driven to ground), and the other side of the differential pair is driven high ($V_{DD} - V_t$).

Following a write operation, as was previously discussed for the read operation, the differential bitline pair must be restored to $V_{DD}$ prior to the next read/writeaccess operation. For a traditional memory array utilizing memory cell 10, the time required for sufficient bitline voltage offset development to reliably read memory cell 10, in addition to the time required to restore one-half of the differential bitline pair from ground to $V_{DD}$ after a write operation, defines the minimum cycle time for such an array. An approach that addresses performance improvements for both the critical read (i.e., bitline offset development) and write (i.e., bitline restore) paths utilizes the concept of separate read and write ports while maintaining the standard single-port cell structure of FIG. 3.

Figure 4:
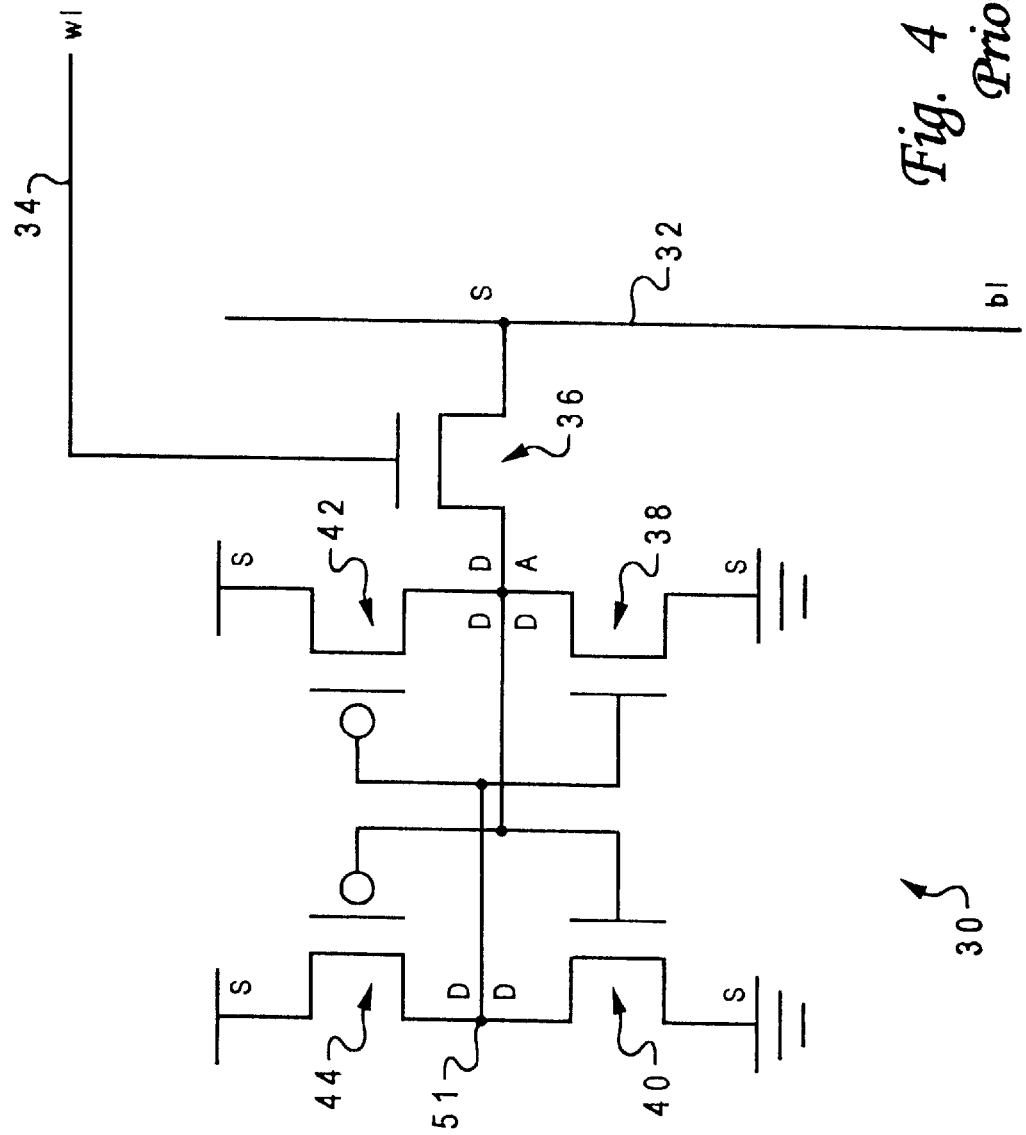
FIG. 4 depicts a schematic diagram illustrative of a prior-art single-ended, single-port five-transistor memory cell.

FIG. 4 depicts a schematic diagram illustrative of a prior-art single-ended, single-port five-transistor memory cell 30. Memory cell 30 includes a P-type transistor 44 whose source is coupled to a power supply and whose drain is coupled to the drain of N-type transistor 40. N-type transistor 40 includes a source tied to ground and a gate tied to the gate of P-type transistor 44. In addition, the gate of N-type transistor 40 is tied to the drain of N-type transistor 38, the drain of P-type transistor 42, and the drain of N-type transistor 36 at node A. The source of P-type transistor 42 is also tied to the power supply (i.e., $V_{DD}$)

Also depicted in FIG. 4, the gate of P-type transistor 42 is connected to the drain of P-type transistor 44 and to the drain of N-type transistor 40 at node 51. The source of N-type transistor 38 is coupled to ground, and the gate of N-type transistor 38 is also coupled to node 51. In addition, the gate of N-type transistor 36 is connected to wordline 34, while the source of N-type transistor 34 is coupled to bitline 32. The source of N-type transistor 36 is connected to bitline 32. A four-transistor device cross-coupled memory latch is formed by N-type transistor 40, N-type transistor 38, P-type transistor 44, and P-type transistor 42.

Thus, in FIG. 4, N-type transistor 36 is utilized to single-endedly access a four-transistor device cross-coupled memory latch. The function of redundant N-type transistors 24 and 22 depicted in FIG. 3 is replaced with N-type transistor 36 depicted in FIG. 4. FIG. 4 depicts a less-traditional memory device than that illustrated in FIG. 3, because the memory device of FIG. 4 includes a write sensitivity resulting from single-ended bitline utilization, such as bitline 32.

Figure 5A:
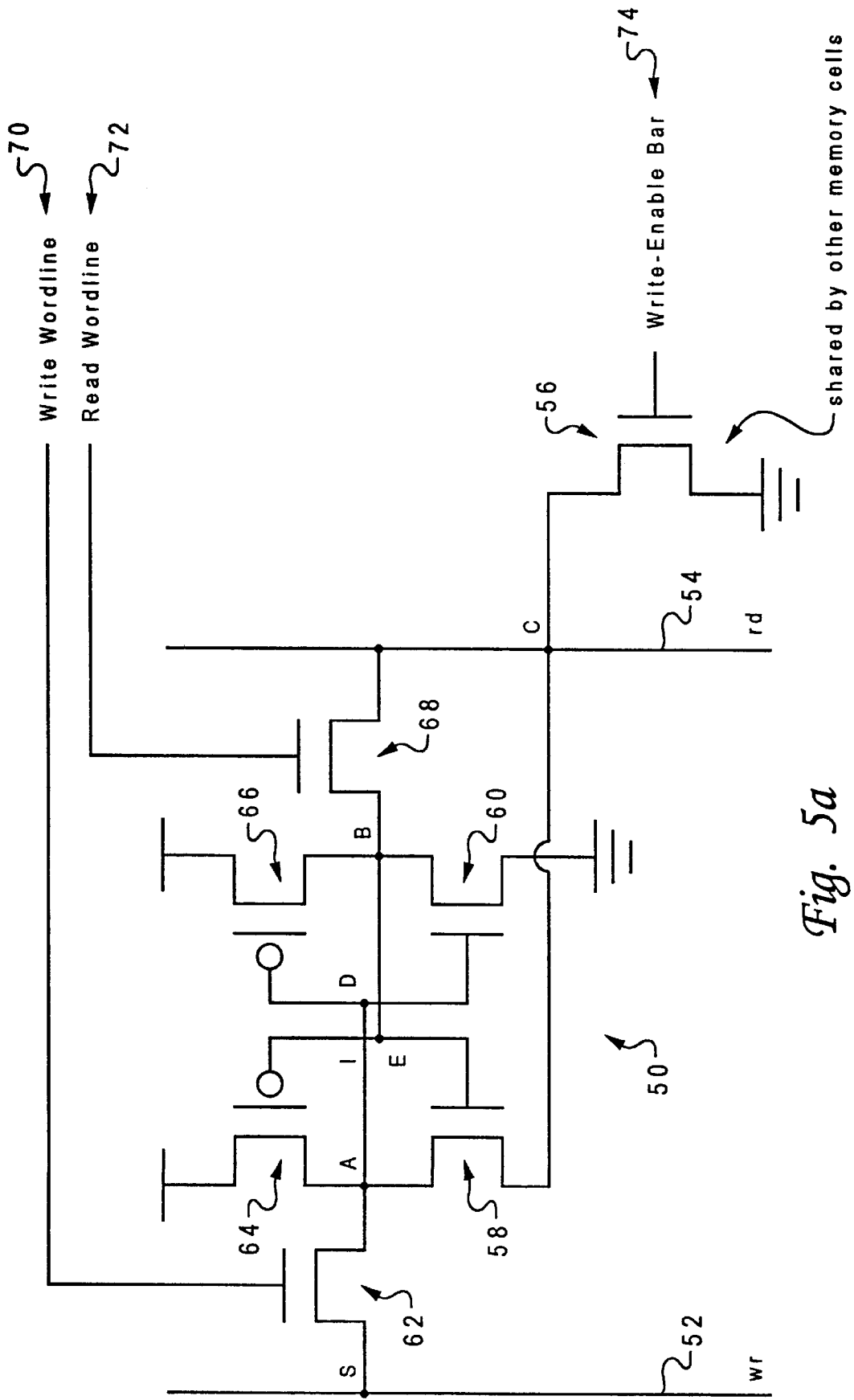
FIG. 5($a$) is a schematic diagram illustrative of a memory cell having separate read wordlines and write wordlines in accordance with the apparatus of the present invention.
Figure 56:
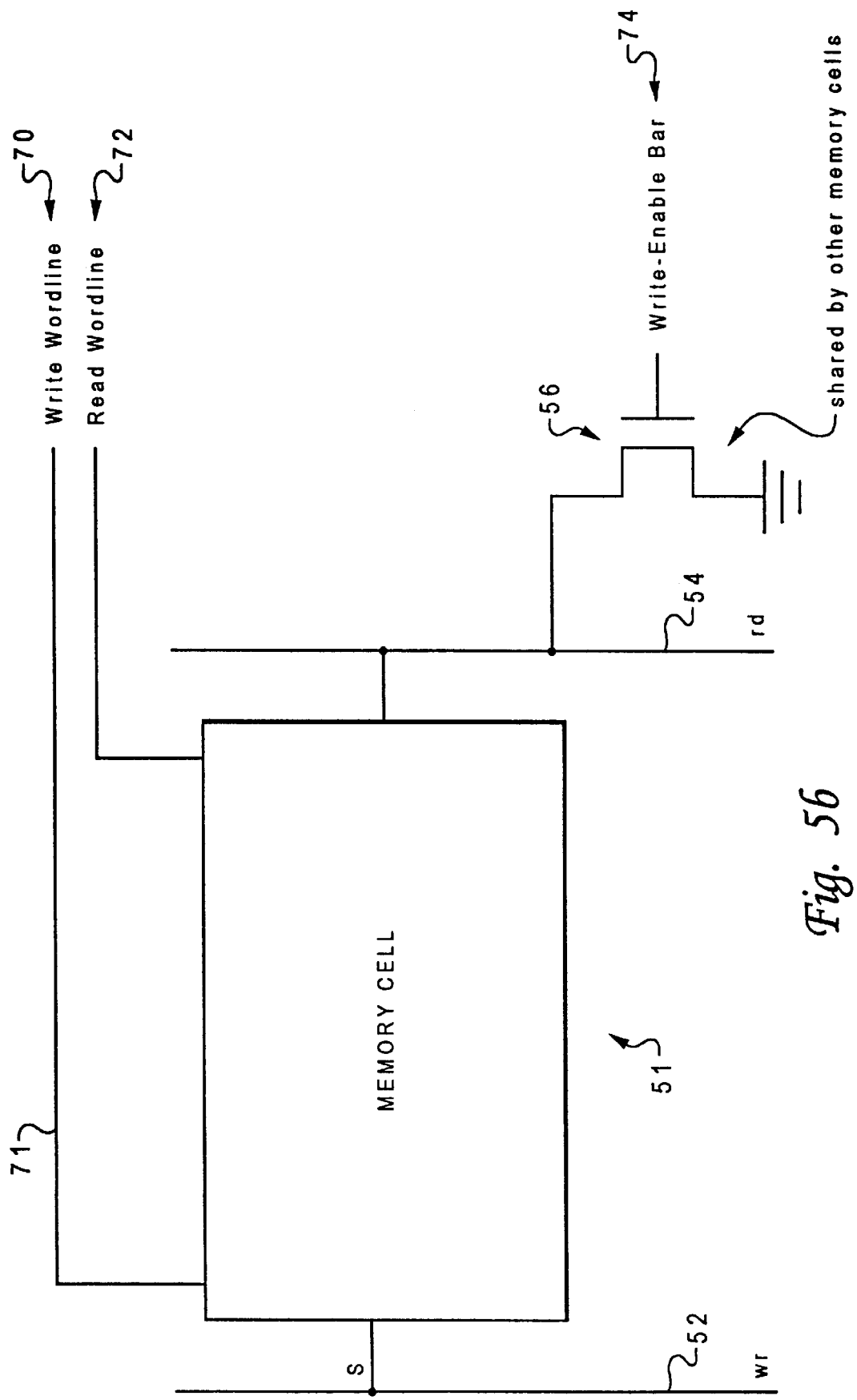

In traditional SRAM memory cells such as the memory cells depicted in FIG. 3, data is written differentially into the cell, because the NMOS transfer device that provides access into and out of a memory cell is not effective in transferring a full $V_{DD}$ (i.e., logic "1") into the cell but instead a logic $1-V_t$ is written. In FIG. 3, it is actually the logic "0" (i.e., ground) on the opposite differential bitline 12 and transfer device 22, that completes the task of writing memory cell 10. With $V_{DD}$ on the gate of an NMOS write transfer device, a logic "0" is written into the other end of memory cell 10 since the gate-source voltage of that particular NMOS is maintained at $V_{DD}$ at all times during a write operation. FIG. 5(a), as depicted herein, presents a device which overcomes the aforementioned problems associated with the configurations of FIG. 3 and FIG. 4.

FIG. 5(a) is a schematic diagram of a memory cell 50 having a separate read wordline 72 and write wordline 70 in accordance with the apparatus of the present invention.

Read wordline 72 is coupled to a gate of N-type transistor 68, a read select device. Write wordline 70 is coupled to N-type transistor 62. Four N-type transistors and two P-type transistors are included within memory cell 50. N-type transistor 56, located outside of memory cell 50, can be shared by a variety of memory cells external to memory cell 50. N-type transistor 58 includes a gate coupled to the gate of P-type transistor 64 at node E. N-type transistor 60 includes a gate coupled to the gate of P-type transistor 66 at node D. The gate of N-type transistor 60 is also coupled to the drain of N-type transistor 62 at node D, the source of P-type transistor 64, the drain of N-type transistor 58 at node A. Thus, node A is coupled to node D. N-type transistor 60 further includes a source coupled to ground and a drain coupled to the source of P-type transistor 66 at node B. Node B is further tied to node E.

N-type transistor 60 in association with P-type transistor 66 form a first inverter circuit. N-type transistor 58 in association with P-type transistor 64 form a second inverter circuit. Node A functions as an output node of the second inverter circuit, while node E functions as an input node of the second inverter circuit. Node D functions as the input node of the first inverter circuit, while node B functions as the output node of the first inverter circuit. Memory cell 50 can thus be described as having first and second inverters for outputting a first or second state in response to a write signal. The first state is a high state (i.e., $V_{DD}$), while the second state is a low state (i.e., ground). The write signal is received by memory cell 50 via writeline 52. N-type transistor 56 positioned outside memory cell 50 functions as a write enable device responsive to a write enable signal. The write enable signal is received by N-type transistor 56 (i.e., the write-enable device) via write enable-bar 74. N-type transistor 56 is also operably connected to the second inverter circuit formed by P-type transistor 64 and N-type transistor 58. The write-enable device is operably connected to this inverter circuit in order to switch this inverter circuit to a third state which does not substantially oppose the write signal. Node B is operably coupled through the read select device (i.e., N-type transistor 68) to a line (i.e., read wordline 72) for reading memory cell 50. The first inverter circuit includes a pull-up device (i.e., P-type transistor 66) for pulling the first inverter circuit to a high state. The first inverter circuit also includes a pull-down device (i.e., N-type transistor 60) which is sized relatively larger than the read select device (i.e., N-type transistor 68), which pulls the output of the first inverter circuit to a low state. In addition, each transistor within a given inverter circuit functions as a switching device such that each switching device has a modulating terminal (i.e., a gate) and first and second conducting terminals (i.e., source and drain).

In FIG. 5(a), the gate of N-type transistor 68 is coupled to read wordline 72, while the gate of N-type transistor 62 is coupled to write wordline 70. The source of N-type transistor 58 is coupled to the drain of N-type transistor 56 at node C. The gate of N-type transistor 56 is connected to write-enable bar 74. The source of N-type transistor 56 is coupled to ground. Readline 54 is coupled to the source of N-type transistor 68, while writeline 52 is coupled to the source of N-type transistor 62. The source of N-type transistor 64 and the source of P-type transistor 66 are tied to $V_{DD}$. Also, in FIG. 5(a), a memory latch is formed for memory cell 50 by the combination of P-type transistor 64, P-type transistor 66, N-type transistor 58 and N-type transistor 60, and N-type transistor 56. The first and second inverter circuits previously mentioned form this memory latch.

Additionally, as depicted in FIG. 5(a), the read-select device (i.e., N-type transistor 68) can be described as having first and second conducting terminals coupled between node B and readline 54 such that the read select device has a modulating terminal (i.e., the gate of N-type transistor 68) operably coupled to a read select signal for selecting to pass a signal from node B to readline 54. The write-select device (i.e., N-type transistor 62) can be described as having first and second conducting terminals operably coupled between node A and writeline 52 such that the write select device has a modulating terminal (i.e., the gate of N-type transistor 62) operably coupled to a write-select signal for selecting to pass a signal from writeline 52 to node A.

Memory cell 50 depicted in FIG. 5(a) utilizes a single-ended bitline 52 attached to a dedicated write port (i.e., write wordline 70), rather than the traditional differential bitline approach of FIG. 3 discussed earlier. Writing a logic "1" into memory cell 50 in FIG. 5(a), as well as memory 30 of FIG. 4, presents an additional write sensitivity not inherent to the traditional six-device memory cell 10 depicted in FIG. 3. Such a write sensitivity is gained by the fact that, in memory cells 30 and 50, there is not a differential logic "0" being written into the other end of the memory cell to facilitate the write. To overcome such a write sensitivity, two design features described herein are available with the design of memory cell 50 that are not associated with the more traditional approach of FIG. 3, nor the approach depicted in FIG. 4 in which single-ended bitlines are utilized.

The first design feature inherent to memory cell 50 is the ability to change the write-beta ratio between the NMOS write-transfer device, N-type transistor 62, and the NMOS storage device, N-type transistor 58. The write-beta ratio is defined by the drive strength of N-type transistor 62 to the drive strength of N-type transistor 58. The NMOS storage device, N-type transistor 58, can be made smaller and the PMOS storage device, P-type transistor 64, larger to increase the effective pull-up strength on the internal latch node (i.e., node A in FIG. 5(a)) while forcing it high ($V_{DD}-V_t$) during a write cycle.

In a traditional cell design having single, commonly shared read and write ports such as the configurations depicted in FIGS. 3, a modification to the beta ratio to improve write operations is not desirable, because the effect of such a modification would be to decrease bitline offset development during a read operation. Another effect of such a modification to the beta ratio is to increase the probability of the occurrence of a read disturb event (i.e., causing the memory cell to change state) with incorrect data read from the memory array. The design of the present invention prevents such an undesirable occurrence due to the fact that such modifications to the beta ratio of the configuration depicted in FIG. 5(a) are actually beneficial as opposed to harmful (e.g., as in the design of FIG. 3).

The second design feature inherent to memory cell 50 is the ability to isolate the connection of the NMOS storage device (i.e., N-type transistor 58), to ground during a write operation. The drain of N-type transistor 58 is connected to the drain of N-type transistor 56, located outside the memory latch formed by the combination of P-type transistor 64, P-type transistor 66, N-type transistor 58, and N-type transistor 60. The source of N-type transistor 56 is connected to ground, and its gate is connected to the write-enable bar 74. During a write operation, access into memory latch is made through an NMOS transfer device whose gate is connected to a wordline with $V_{DD}$ applied. Write-enable bar 74 becomes ground, and the NMOS isolation device (i.e., N-type transistor 56) is disabled, allowing the common node N between the isolation NMOS device (i.e., N-type transistor 60) and the NMOS storage device (i.e., N-type transistor 58) within the memory latch to float (i.e., no potential is applied). Floating common node N allows the internal latch node in the memory cell to rise unencumbered toward $V_{DD}-V_t$ without the effects of ground to fight the pull-up and limit the potential on that node through an active voltage divider, when connected to ground. Note that N-type transistor 60 can also function within memory cell 50 as an NMOS transfer device.

Another significant advantage of memory cell 50 of FIG. 5(a) relates to the ability to access data from the memory latch during a read operation. As discussed earlier, read performance is measured by the minimum time required to discharge the logic 0 bitline to the minimum offset (i.e., relative to the other bitline) required to reliably detect the binary state of the memory latch. The rate at which the bitline discharges is a function of a voltage-divider network located between a transfer NMOS device (i.e., N-type transistor 60) and the memory latch's NMOS storage device for the read port. Making the NMOS storage device (i.e., N-type transistor 58) larger increases the rate at which the read bitline discharges and decreases the time required to complete the read. While this modification to the NMOS storage device works well with the cell design depicted in FIG. 5(a) to improve read performance, such a modification works against writing the more traditional single-ended bitline cell shown in FIG. 4. Increasing the NMOS storage device size in FIG. 4 lowers the maximum voltage that can be applied to node A during a write of '1' until, at some point, the cell cannot be written with a single-ended bitline approach.

In FIG. 5(a), one of the two transistors utilized to access the traditional four-device, cross-coupled memory latch forms a dedicated write access path 62 into the latch, while the other, N-type transistor 68, becomes a dedicated access path 62 from which the contents of memory only can be read. Separating the read from the write in this way allows the design of the critical timing path (i.e., address in to data out) to be a function of the read timing only. The bitline restore time (i.e., recovery to $V_{DD}$) following a read is shorter (i.e., bitlines partially discharged) than for a write (i.e., bitlines fully discharged) and, therefore, requires less of the overall cycle to complete the restore prior to another array access.

Less restore time corresponds to shorter cycle times and higher frequencies of operation. During the read operation, a simultaneous write operation can occur in the background. Writing the memory latch formed by P-type transistor 64, N-type transistor 58, P-type transistor 66, and N-type transistor 60 is generally faster than the time required to generate sufficient bitline offset to reliably read memory cell 50. This, in conjunction with no restore requirements on the write bitline 52, positions the timing of the write operation easily within a single read (i.e., "zero-write-cycle") timing boundary.

An additional advantage of the configuration of FIG. 5(*a*) from which the title of the present invention implies, is the zero-cycle requirement for a write. With the isolation between read and write ports, a write operation essentially occurs simultaneously with a read operation. In fact, there are no dedicated write cycles, only read cycles, from which the title of the invention implies (i.e., "zero write cycle"). Simultaneous read and write operations employ the use of a fill buffer to store the contents of the write in the event that the read and write addresses are identical. In this case, the read operation proceeds uninterrupted, and the write operation "waits" for another cycle in which the address conflict is resolved (i.e., read address does not equal write address), and the write operation is completed. The write address location must also be stored for later use. Additional address compare logic overhead is required to identify an address collision between read and write.

Traditional memory L1 and L2 cache designs include, as part of their design, the ability to store data as it becomes available on the bus. A cache is a special-purpose buffer storage, smaller and faster than main storage in a computer system, and utilized to hold a copy of instructions and data obtained from the mail storage and likely to be needed next by a processor. In such caches, the bus width is usually smaller than the width of the cache line and so several requests for the bus are made until the entire length of the cache line has been stored into a fill buffer register in preparation for writing its contents into the memory array.

Such a bus is typically a facility for transferring data between several devices located between two end points, with only one device being able to transmit at a given moment. Read operations continue to execute while data from the bus is being stored within a register of wordline length. Once the register is filled, the write wordline is enabled, and the contents of the register are written into the memory latch locations defined by the active write wordline. In the case of the present invention, while both read and write operations are being processed simultaneously, the data storage register can also receive data from the bus for subsequent write operations. Because there is an independent write port (i.e., write wordline 70) available, data can be transferred from the bus to the memory array or cache in the same manner as when a read is available.

The memory cell design of the present invention offers several significant design features over that of the aforementioned traditional memory cell devices. These advantages are summarized as follows: (1) simultaneous reads and writes with no dedicated write-cycle requirements; (2) read performance optimized independently of the write path; (3) write performance optimized independently of the read path; (4) cycle time requirements which are squeezed to an absolute design minimum with a write bitline restore removed from the critical timing path; and (5) an additional power savings with no requirement for write bitline restore.

In FIG. 5(*a*) and FIG. 5(*b*), like parts are indicated by like numbers. FIG. 5(*b*) is a high-level schematic diagram illustrative of a memory cell having separate read wordlines and write wordlines in accordance with the apparatus of the present invention. FIG. 5(*b*) is a generalized version of the configuration depicted in FIG. 5(*a*). Memory cell 51 depicted in FIG. 5(*b*) operates in the same manner as memory cell 50 depicted in FIG. 5(*a*). However, memory cell 51 may include transistors of varying numbers and varying types to accomplish the same task as a memory cell. Although the present embodiment describes a memory cell in which six transistors are utilized, other configurations utilizing fewer or an increased number of transistors can be utilized in accordance with the apparatus of the present system. Such a configuration need only operate consistent with the concept of a zero-write-cycle transistor memory cell as described herein.

While the invention has been particularly shown and described with reference to a preferred embodiment, it will be understood by those skilled in the art that various changes in form and detail may be made therein without departing from the spirit and scope of the invention.

What is claimed is:

1. A zero write-cycle memory apparatus for storing information, comprising:
   a memory cell for the storage of binary data having first and second inverters for outputting a first or second state in response to a write signal, such that data may be simultaneously read from and written to said memory cell via isolated read and write wordlines; and
   a write-enable device responsive to a write-enable signal and operably connected to at least one of said inverters, wherein said at least one of said inverters can be switched to a third state which does not substantially oppose said write signal, such that data is simultaneously read from and written to said memory cell without dedicated write-cycle requirements.

2. The zero write-cycle memory apparatus of claim 1 wherein said memory cell further comprises:
   a first node operably coupled through a read-select device to a read wordline for reading said memory cell, wherein an output of said first inverter is operably coupled to said at least one first node, wherein said first state comprises a high state and said second state comprises a low state;
   said first inverter comprising:
      a pull-up device for pulling an output of said first inverter to said high state; and
      a pull-down device sized relatively larger than said read-select device,
   wherein said pull-down device pulls said output of said first inverter to said low state.

3. The zero write-cycle memory apparatus of claim 2 wherein said memory cell further comprises:
   a second node;
   an input of said first inverter and an output of second inverter operably connected to one another at said first node; and
   an output of said first inverter and an input of said second inverter operably connected to one another at said second node.

4. The zero write-cycle memory apparatus of claim 3 further comprising:
   each inverter comprising:
      a first switching device and a second switching device, each switching device having a modulating terminal, a first conducting terminal, and a second conducting terminal; and said first switching device having one of said conducting terminals operably connected to a source of said other conducting terminal operably connected to one of said conducting terminals of said second switching device.

5. The zero write-cycle memory apparatus of claim 4 further comprising:

a write select device comprising:
a first conducting terminal and a second conducting terminal operably coupled between said second node and a writeline, said write-select device having a modulating terminal operably coupled to a write wordline comprising a single-ended bitline, wherein said write wordline provides a write-select signal for selecting to pass a signal from said writeline to said second node, such that the presence of a binary data signal at said write wordline optimizes write performance independently of a read path from said memory cell; and said read-select device further comprising:
a first conducting terminal and a second conducting terminal operably coupled between said first node and a readline, said read-select device having a modulating terminal operably coupled to said read wordline, wherein said read wordline provides a read-select signal for selecting to pass a signal from said first node to said readline, such that the presence of a binary data signal at said read wordline optimizes read performance independently of a write path into said memory cell.

6. A zero-write cycle memory apparatus for storing information, comprising:

a plurality of memory cells for the storage of binary data, wherein each memory cell among said plurality of memory cells includes a first inverter and a second inverter, wherein said first inverter and said second inverter output a first state or a second state in response to a write signal, such that data may be simultaneously read from and written to each memory cell via isolated read and write wordlines;

a write-enable device responsive to a write-enable signal, said write-enable device operably connected to said plurality of memory cells in order to switch at least one inverter disposed within said each memory cell to a third state that does not substantially oppose said write signal, such that data is simultaneously read from and written to each memory cell without dedicated write-cycle requirements; and wherein each memory cell further comprises:
a first node operably coupled through a read-select device to a read wordline for reading said memory cell; and
a second node operably coupled through a write-select device to a write wordline for writing to said memory cell so that one of said memory cells may be read concurrently while writing to another one of said memory cells.

7. The zero-write cycle memory apparatus of claim 6 wherein said memory cell further comprises:

an input of said first inverter and an output of second inverter operably connected to one another at said first node; and an output of said first inverter and an input of said second inverter operably connected to one another at said second node.

8. The zero-write cycle memory apparatus of claim 7 wherein each inverter comprises:

a first switching device and a second switching device, each switching device having a modulating terminal, a first conducting terminal, and a second conducting terminal; and said first switching device having one of said conducting terminals operably connected to a source of said other conducting terminal operably connected to one of said conducting terminals of said second switching device.

9. The zero-write cycle memory apparatus of claim 8 further comprising:

said write-select device comprising:
a first conducting terminal and a second conducting terminal operably coupled between said second node and a writeline comprising a single-ended bitline, said write-select device having a modulating terminal operably coupled to a write wordline, wherein said write wordline provides a write-select signal for selecting to pass a signal from said writeline to said second node, such that the presence of binary data signal at said write wordline optimizes write performances independently of a read path from said memory cell; and said read-select device comprising:
a first conducting terminal and a second conducting terminal operably coupled between said first node and a readline, said read-select device having a modulating terminal operably coupled to a read wordline, wherein said read wordline provides a read-select signal for selecting to pass a signal from said second node to said readline, such that the presence of a binary data signal at said read wordline optimizes read performance independently of a write path into said memory cell.

10. The zero-write cycle memory apparatus of claim 5 wherein said write wordline comprises a dedicated write port.

11. The zero-write cycle memory apparatus of claim 10 further comprising:

said read-select device comprising an n-type transistor having a gate comprising said modulating terminal of said read-select device; and said write-select device comprising an n-type transistor having a gate comprising said modulating terminal of said write select device.

12. The zero-write memory cell apparatus of claim 11 further comprising:

said write-enable device comprising an n-type transistor, wherein a gate of said write-enable device comprises a write-enable bar said first switching device of said first inverter comprising a p-type transistor:

said second switching device of said first inverter comprising an n-type transistor;

said first switching device of said second inverter comprising a p-type transistor; and said second switching device of said second inverter comprising an n-type transistor.

13. The zero-write cycle memory apparatus of claim 9 wherein said write wordline comprises a dedicated write port.

14. The zero-write cycle memory apparatus of claim 13 further comprising:

said read-select device comprising an n-type transistor having a gate comprising said modulating terminal of said read-select device; and said write-select device comprising an n-type transistor having a gate comprising said modulating terminal of said write select device.

15. The zero-write memory cell apparatus of claim 14 further comprising:

said write-enable device comprising an n-type transistor, wherein a gate of said write-enable device comprises a write-enable bar said first switching device of said first inverter comprising a p-type transistor;

said second switching device of said first inverter comprising an n-type transistor;

said first switching device of said second inverter comprising a p-type transistor; and said second switching device of said second inverter comprising an n-type transistor.

* * * * *